United States Patent [19]

Weglin

[11] Patent Number: 4,497,686

[45] Date of Patent: Feb. 5, 1985

[54] FINE-LINE DIE AND METHOD OF MAKING SAME

[75] Inventor: Walter Weglin, Bellevue, Wash.

[73] Assignee: Jerobee Industries, Inc., Redmond, Wash.

[21] Appl. No.: 590,722

[22] Filed: Mar. 16, 1984

Related U.S. Application Data

[63] Continuation-in-part of Ser. No. 369,906, Apr. 19, 1982, Pat. No. 4,437,924, and a continuation-in-part of Ser. No. 365,368, Apr. 5, 1982, Pat. No. 4,447,286.

[51] Int. Cl.³ .......................... C23F 1/02; B44C 1/22; C03C 15/00; C03C 25/06
[52] U.S. Cl. ................................ 156/651; 156/659.1; 156/661.1; 156/905; 156/515; 430/306
[58] Field of Search ............ 156/650, 651, 656, 659.1, 156/661.1, 905, 251, 515; 101/32, 30, 31; 430/306, 307, 310

[56] References Cited

U.S. PATENT DOCUMENTS 4,437,924  3/1984  Weglin ................................ 156/651
4,447,286  5/1984  Weglin ................................ 156/515

Primary Examiner—William A. Powell
Attorney, Agent, or Firm—Hughes, Barnard & Cassidy

[57] ABSTRACT

A method for fabricating a precision die having a line-and-space array by chemical milling the working face of an etchable workpiece to form a plurality of raised die elements separated and bounded by a plurality of cavities, including separating cavities and background cavities, is comprised of the steps of forming an etchant-resistant surface pattern of pockets penetrating slightly into the working face of the workpiece and at least partially overlapping and substantially conforming to the spatial disposition of a desired configuration for the die elements to be produced, and then selectively etching the workpiece in etchant-active regions intermediate and outwardly bounded by the pockets to undercut the same and form at least the conformation of the separating/background cavities within the working face. The step of forming the etchant-resistant pattern of pockets is preferably a two-stage procedure comprised of first chemical milling shallow pockets in the workpiece in the desired pattern and then loading those pockets with an etchant-resistant fill extending in an oversized pattern with respect to the surface width dimension of the die elements. The workpiece is selectively milled in the etchant-active regions to form cavity precursors having a surface width dimension approximately equal to the desired width for the spaces in the finished die; followed by selectively milling the regions intermediate those cavities to establish raised die elements conforming to the line array of the finished die.

13 Claims, 11 Drawing Figures

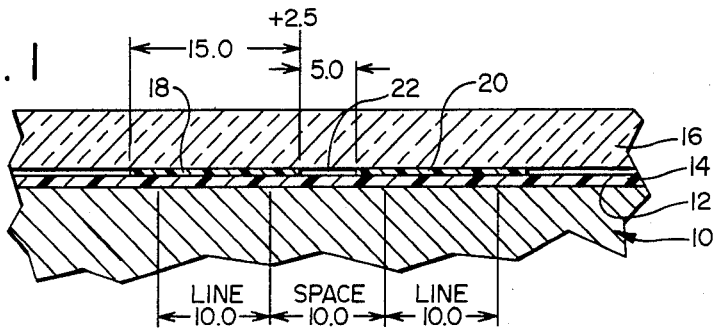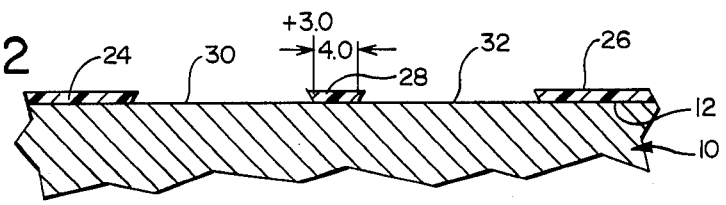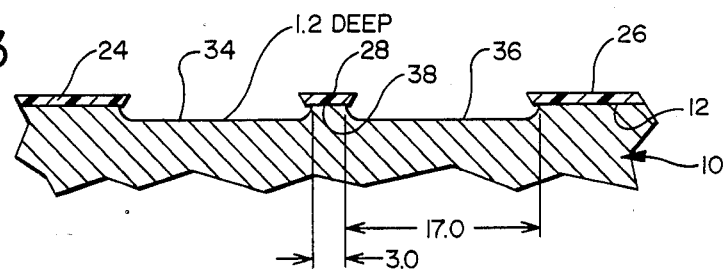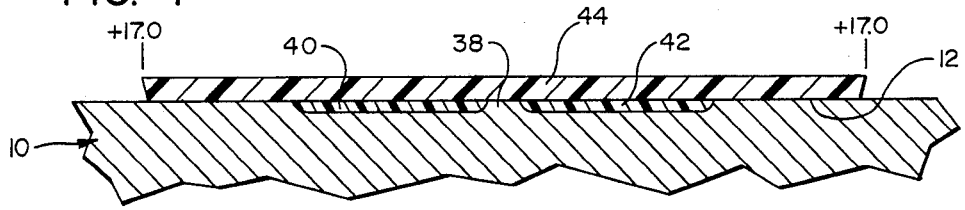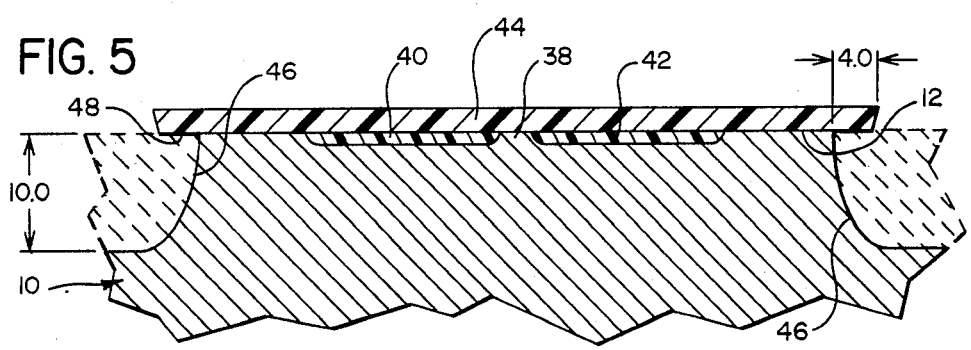

FINE-LINE DIE AND METHOD OF MAKING SAME

CROSS REFERENCE TO RELATED PATENTS AND APPLICATIONS

The present application is a continuation-in-part of copending application Ser. No. 369,906 filed Apr. 19, 1982, now U.S. Pat. No. 4,437,924 and Ser. No. 365,368 filed on Apr. 5, 1982, now U.S. Pat. No. 4,447,286, and is related to application Ser. No. 573,517, filed on Jan. 25, 1984, itself a continuation-in-prat of the latter; all of which are incorporated herein by reference and relied upon.

BACKGROUND OF THE INVENTION

1. Field of the Invention

The present invention relates, generally, to methods for fabricating precision dies and, more especially, to methods for chemical milling an etchable workpiece to make a precision stamping or trimming die for making circuit boards or the like, where the raised die elements are formed in a highly compressed pattern separated by cavities having a good working depth. The present invention is particularly well adapted to the fabrication of fine-line dies having a line-and-space pattern on the order of 0.010" (10 mils). The present invention also relates to fine-line dies formed in accordance with these methods.

2. Description of the Background Art

The present inventor's U.S. Pat. Nos. 3,758,350, 4,053,348, and 4,102,735 disclose, inter alia, methods for making precision stamping dies useful in the manufacture of circuit boards, such as printed wiring boards. Briefly stated, the dies disclosed in those patents include a plurality of raised die elements separated by cavities, which dies are then used to stamp and adhere a metal foil to a prepared substrate bearing a suitable thermoadhesive. The metal foil is pressed against the substrate and severed by the action of the die elements, which are preferably heated, providing an intimate bond between the metal foil within the pattern of the die elements and the substrate while activating the adhesive.

It is important that the die used in the stamping of such circuit boards be formed with precise and sharp die element edges. If the elements are imperfectly formed there is a tendency for an imperfect stamping operation resulting from the lack of a clean cut; e.g., due to dulled edges which can leave behind small ribbons of foil bridging circuit elements to form an undesired connection. In this regard, it is also important that the raised die elements be separated by cavities having a good working depth to insure adequate penetration of the die elements through the foil.

The trend in manufacturing circuit boards is toward miniaturization without a loss of the ability of the board to carry adequate current. Thus, on the one hand designers strive to provide circuit boards with elements closer and closer together while, on the other hand, the demand for improved current ratings requires thicker and thicker foils be used. These two desires on the part of designers are somewhat antagonistic and have taxed conventional chemical milling techniques to the realistic limit. In manufacturing a fine-line knife-edge foil cutting die (i.e., one having a line and space pattern of approximately 0.015" or less), it is difficult to achieve sufficient cavity depth between patterns with conventional chemical milling processes and thereby achieve the goals mentioned above. This results in part because of inherent limitations on photo resist films used to mask portions of the die blank during the milling procedure to form the die cavities. And yet, still further demands to achieve finer patterns—10 mil (0.010") mil line-and-space arrays—are being made. The progression downward is extremely difficult as the step-wise size reductions are not linear in terms of the ease or difficulty presented to die fabricators. Their ability to respond to marketplace demands is now severely circumscribed, if not curtailed totally, by limitations in photo resist techniques.

The typical dry film photo resist materials used to mask portions of the face of a die blank, to render those portions etchant passive, are usually films having a thickness on the order of 0.001-0.002". They are typically made from thermoplastic compositions so that the film may be adhered to the metal die blank by the application of heat and pressure. These combined characteristics of heat sensitivity and relatively thin film thickness have proved to be limiting factors in the adaptability of conventional dry film resists in the formation of fine-line dies. For example, when etching a die blank bearing such a thin-film resist, a process typically conducted by disposing the blank in a bath of ferric chloride etchant heated to about 100° F., etchant begins removing material in the etchant-active regions on the die blank (defined between etchant-passive regions bearing photo resist film) and undercuts the photo resist film at the same time. Optimally, the etchant would simply preferentially attack the regions bounded by adjacent films, but this is not even a theoretical possibility given the current state of the art. Rather, as the resist film is undercut, the portion extending over the undercut region softens due to the temperature of the etchant and flexes due to the activity within the bath. Thus, a weakened line is developed along the interface between the bonded film and the metal substrate supporting same. Softening and flexing allow the formation of a small radius at this bond line, usually one on the order of 0.001-0.002", encouraging increased undercutting and the formation of an undesirably more positive sidewall slope in the cavity being formed. Providing a thicker resist film or films made from compositions which are less sensitive to heat are not realistic approaches to the resolution of this significant problem. This is particularly true when one is faced with the task of etching a fine-line die where line and space patterns are less than about 0.015" (let alone the dies of the current trend to 0.010" line-and-space patterns) and where tight pattern areas may have only a few thousands of an inch separation.

While the optimum limitation on open space in a 0.002" dry film resist is about 0.006", there have been attempts to utilize a design where spacing is on the order of 0.004" between patterns. However, this requires labor-intensive and extremely tedious subsequent processing to remove resist "scum" in the tighter pattern areas while the later etching of such patterns produces only about one-half the cavity depth of more open areas. Other efforts have included the use of a 0.001" resist film, but these too have met with limited acceptance; particularly since these thinner resist films undercut faster and provide less cavity depth overall. Further problems are caused because attempts to trim a dry film resist usually result in chipping and a disruption of the bond between the resist and metal substrate at the pattern edges due to the brittle nature of the film. This, in turn, leads to ragged chem-milled edges which are highly undesirable.

Consequently, the need exists to provide a method which will allow the fabrication of a die of the character aforesaid where the pattern of die elements is considerably compressed while the surface profile thereof is maintained with a good edge-to-cavity depth relationship.

SUMMARY OF THE INVENTION

The present invention advantageously provides a method which permits the chemical milling of a die, and especially a line-and-space die, to form raised die elements in a much tighter pattern than heretofore available without the unacceptable loss of good cavity depth proximate the raised die elements. Along these lines, the present invention now allows die designers to achieve 10 mil (0.010") line-and-space die configurations on a reliable and repetitive basis. The present invention is also desirable for its ability to provide a discrete, partial surface mask on an etchable workpiece, which mask is relatively insensitive to the temperature and physical activity of the bath and thereby less prone to edge flexing. These advantages of the present method may be realized in the chemical milling of most any etchable substrate, thus rendering the instant invention particularly desirable in the fabrication of fine-line knife-edge foil cutting dies used to make circuit boards by a stamping operation.

The foregoing and other advantages are realized in accordance with the present invention through a method for fabricating a precision die by chemical milling the working face of an etchable workpiece to form a plurality of raised die elements separated and bounded by a plurality of cavities, including separating cavities and background cavities, which method comprises the steps of forming an etchant-resistant surface pattern of pockets penetrating slightly into the working face of the workpiece at least partially overlapping and substantially conforming to the spatial disposition of a desired configuration for the die elements, and then selectively etching the workpiece in etchant-active regions intermediate and outwardly bounded by the pockets to undercut the same and form at least the conformation of separating/background cavities within the working face. The step of forming the etchant-resistant pockets most preferably yields oversized pockets in terms of the surface width dimension thereof vis-a-vis the die element to be formed. The sequential etching step within active regions intermediate and bounded by these resistant pockets is then conducted to undercut the pocket area in order to yield cavity precursors for the separating cavities intermediate the die elements and background cavities outwardly bounding the perimeter thereof. That intermediate etching is most preferably conducted until the surface width dimension of the cavity precursors is approximately the same as that desired for the finished die, corresponding to the space dimensions thereof. Consequently, a raised die region remains conforming spatially and generally dimensionally to the desired pattern for raised die elements constituting the line width of the finished die. This raised region is subjected to a secondary milling procedure involving forming an etchant-resistant surface pattern of boundary grooves along marginal edges followed by a selective etching within the remaining active region to undercut the grooves, continuing the etching procedure to yield the raised die elements. In this manner very tightly compressed patterns can be achieved and dies having element densities far in excess of that which may be yielded by conventional photo resist techniques provided, but without the need to sacrifice good cavity depth.

The steps of forming the etchant-resistant pockets and etchant-resistant grooves preferably comprise the steps of adhering to the die blank suitable thin-film photo resists having the desired patterns, followed by exposure and etching in a rather conventional procedure to provide surface depressions for receiving an etchant-resistant fill. The most preferred fill for these purposes is epoxy. Not only does the epoxy provide a very rigid, etchant-resistant filler which is not as prone to failure during normal etching at somewhat elevated temperatures, the same may more easily be trimmed than fragile resist films should that be necessary or desirable during intermediate stages of manufacture. The epoxy fill also provides a stable support surface for photo resist films which may be deposited during intermediate fabrication stages. It is also preferred to charge the cavity precursors with an etchant-resistant filler such as epoxy once those precursors have been formed; in this case likewise to support photo resist films used to establish the boundary grooves and also to protect those cavities during subsequent etching. In that case, a further preference is to include a thin film of an etchant-resistant composition at the juncture between the etchable workpiece and the fill as, for example, a film of gold, platinum, or similar passive material.

Dies produced in accordance with the method of the present invention exhibit much better surface conformation and experience far less rejection for lack of dimensional tolerance either as among the die elements in the active region of the die or along a given element with respect to the edge profile. Extremely fine line-and-space configurations may be achieved, much finer than is possible with ordinary photo resist techniques. Thus, the die itself is characterized by many specific improvements in processability and ultimate use as a consequence of the practice of the method of the present invention. Further along these lines, for example, the retained passive film tends to improve lubricity while reducing oxidation tendencies of the finished die when it is put to use.

An understanding of other advantages, and a fuller appreciation of the procedure of the present invention and the dies resulting therefrom, will be gained upon an examination of the following detailed description thereof, taken in conjunction with the figures of drawing, wherein:

BRIEF DESCRIPTION OF THE DRAWINGS

The figures of drawing herein are schematic representations which illustrate a highly preferred sequence for forming a precision die in accordance with the present invention and thus exemplify one approach to this end. The dimensions shown are approximately to a 100× scale; those illustrating the most simplified type of die pattern, but from which those skilled in the art may extrapolate with ease given the principles described herein. The highly preferred sequence set forth within these figures makes possible the attainment of a 10 mil (0.010") line-and-space die and, with that thought in mind, representative dimensions are included in the figures in order that those skilled in the art may follow the progression as detailed more fully in the ensuing description; although those skilled artisans will appreciate that these exemplary dimensions are provided simply to facilitate an independent understanding of the underlying manipulative step of the procedure and are not crucial to its successful performance. With that background understood:

FIG. 1 is a side elevation of a die blank bearing a thin-film photo resist for exposure through a glass plate having impressed thereon a photographic design for yielding exposed and unexposed regions to define a general pattern for raised die elements corresponding to "lines" separated by "spaces", both of which are intended in this particular case to be 10 mils in the finished die;

FIG. 2 is a side elevation showing the die blank following exposure and development of the resist film illustrated in FIG. 1;

FIG. 3 is a side elevation of the die shown in FIG. 2, here following a preliminary etching technique to yield recesses or depressions in the working face;

FIG. 4 is a side elevation representing the next sequential stage in the chemical milling of the die blank, here with an etchant-resistant fill within the milled pockets supporting an oversized dry film resist;

FIG. 5 is a side elevation view of the die shown in FIG. 4, following a main background cut to initiate background cavity precursors;

DETAILED DESCRIPTION OF THE INVENTION

Figure 6:
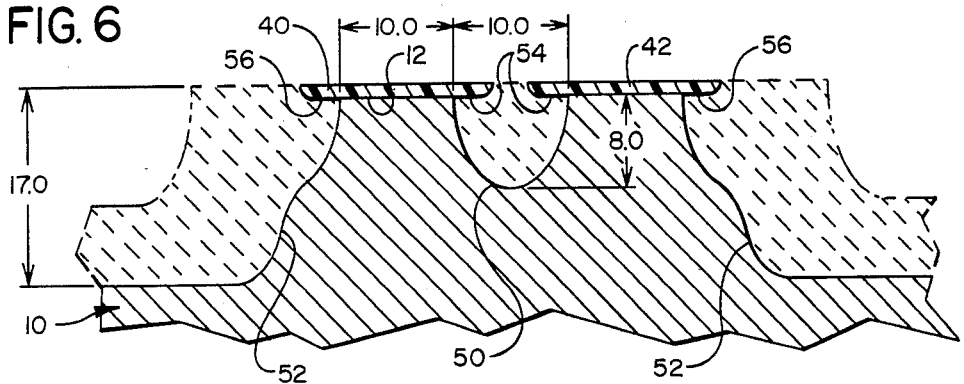
FIG. 6 is a side elevation showing the next sequential step in the procedure, wherein the die shown in FIG. 5 is etched further to establish separating cavities as well as progressive formation of the background cavities.

The present invention relates, generally, to methods for fabricating precision dies and, more especially, to methods for chemical milling an etchable workpiece to make a precision stamping or trimming die for fabricating circuit boards or the like, where the raised die elements are formed in a highly compressed pattern separated by cavities having a good working depth. The present invention also relates to fine-line dies formed in accordance with these methods. Accordingly, the present invention will now be described with reference to certain preferred embodiments within the aforementioned contexts including specific exemplifications of procedures to be undertaken and exemplary dimensions to show a representative technique for its implementation; albeit, those skilled in the art will recognize that such a description is meant to be illustrative only and should not be deemed limitative on the broader scope of the instant technique.

Prior attempts to fabricate precision dies with tight pattern areas in the resist film (i.e., those where spacing is less than about 0.006") have not been terribly successful where conventional chemical milling procedures are employed in the fabrication process. When a conventional 0.002" resist film is utilized to provide the protective etchant-resistant overlay on a die blank, pattern spacing down to about 0.004" could be achieved only at the expense of tedious, labor-intensive efforts; for example, it has been necessary to remove resist "scum" by hand operations. And, at that, subsequent chem-milling produced only about one-half the cavity depth achieved in the more open areas of the resist film pattern. Attempts to alleviate the problem by using a 0.001" resist film were sorely disappointing in an effort to compress the pattern of elements, since this thinner film undercut at a much faster rate ultimately providing less cavity depth overall. Mechanically trimming the resist film is usually not a visible alternative since the same is brittle and usually chips or loosens along or near the trim line which, in turn, causes ragged chem-milling edges which are obviously undesirable. Faced with those types of problems, it has historically been a very difficult endeavor to produce a 0.015" line and space die, since the etching procedure demanded line-and-space patterns in the resist of about the aforementioned dimensions. The procedure outlined in the present inventor's application Ser. No. 369,906 filed on Apr. 19, 1982 has permitted the attainment of that goal. Now the art has moved to demands for a 0.010" line and space array which taxes conventional dry film resist technology beyond the crossover of its capability. Adapting the more recent technology of the technique disclosed and claimed in application Ser. No. 369,906 as an improvement fostered by the success of the that development has led to the ability to realize the successful fabrication of these much more compressed die patterns.

The underlying technique permitting a vast reduction in the pattern separation first described in the application immediately aforementioned involves, inter alia, the formation of an etchant-resistant surface pattern of boundary grooves penetrating slightly into the working face of the etchable workpiece from which the die is to be fabricated. Those boundary grooves are formed outwardly proximate and substantially conforming to a desired configuration for the raised die element precursors and thus define an overall spatial disposition for those elements. The procedure then continues with a selective etching of the workpiece in regions bounded by those grooves to undercut them and form recessed cavities outwardly proximate and substantially conforming to the complementary configuration of the die element precursors. The technique for forming the boundary grooves is most preferably one involving generally conventional photo resist procedures; for example, chemical milling shallow grooves in regions defined within an open photo resist pattern. Thence, those grooves are loaded with an etchant-resistant fill; epoxy being the most preferred. More specifically, the formation of boundary grooves is comprised of the preferential steps of providing the working face of the die blank with a protective overlay of an etchant-resistant film having a negative pattern corresponding to the positions and spatial distribution of the boundary grooves, whereby the working face is etchant-active within the contours of that pattern; and thence etching the working face to form shallow grooves in the pattern of the boundary grooves, followed by disposition of the filler therein. The die blank is then repetitively etched in the regions between and bounded by the grooves in order to remove material therefrom and expose the interface at the fill boundary, periodically mechanically removing the fill extending beyond the undercut as a process option, and continuing on until the desired cavity width and depth is achieved. That procedure requires but a single photographic image to be used in establishing the pattern of cuts which define the finished die element patterns, the photographic pattern being only slightly oversized and comprised of fairly narrow line width corresponding to the location of the boundary grooves to be formed in the blank. Thus, that procedure is very simple, expedient in the layup and intermediate stage of die fabrication, and yet yields a finished die product of extremely close tolerance with highly compressed die element regions. That basic technique is adapted, in one further aspect of the present invention, to reduce yet smaller the inter-element separation and thereby increase the die element density which can be achieved.

The procedure of the present invention carries forward the use of rigid etchant-resistant deposits impressed within the working face of a die blank to define contours about that working face between which etching proceeds. In a related aspect which is consistent with the procedure aforesaid, the rigid deposit is undercut during the etching procedure in a controlled manner, taking what heretofore had been deemed an unwanted factor in chemical milling and harnessing it for the purpose of producing finer die configurations. This procedure is best considered with reference to the figures of drawing, in each of which like elements are identified with like reference characters.

Turning to FIG. 1, a die blank, designated generally as 10, is first prepared by a preliminary surface grinding in order to achieve a flat face 12 which is parallel with a bottom face (not shown); all as is generally conventional in the preparation of a die blank for chemical milling. The die blank 10 is customarily a steel blank of an oil or air hardening tool steel, usually of rectilinear configuration and of several inches as measured at its working face (e.g., 6" by 9"). A thin film photo resist 14 is adhered to the working face 12 in any convenient manner; the most preferred being in accordance with the present inventor's procedure outlined in application Ser. No. 364,523, filed on Apr. 1, 1982 entitled "Press Laminating Dry Film Photo Resist." In any event, the resist film 14 is most preferably a negative acting resist having photosensitivity to ultraviolet light. A glass plate or film 16 bearing a desired pattern for the overall conformation of a finished die is disposed (emulsion side down) over the resist film 14 in order to transfer photographically that image to the resist. In this instance, as the dry film resist 14 is a negative acting resist, the exposure plate 16 is a positive plate wherein the circuit areas are black or opaque to the exposure radiation, typically ultraviolet light. Thus, for purposes of exemplification, the plate 16 includes first and second opaque regions 18 and 20 separated by a transmissive region 22; the regions 18 and 20 corresponding for purposes of illustration to line areas and the transmissive portion 22 to a space area in the die to be fabricated, each utlimately to have a 0.010" (10 mil) width dimension.

Sensitizing radiation is passed through the plate 16 to expose the dry film resist which is then developed in accordance with conventional techniques. That leaves a blank in the condition illustrated generally in FIG. 2; a retained resist film in regions 24, 26 and 28 which protect the working face 12 while leaving etchant-active areas 30 and 32. It will be observed with reference to FIG. 2 that the edges of each of the retained films (e.g., the region 28) are slightly undercut during the developing procedure; while a substantial limitation respecting the processability of dies in the past, a situation which is tolerable in practicing the present invention. Irrespective of that consideration, the die blank as represented in FIG. 2 is subjected to an etching procedure in conventional form as by means of a ferric chloride bath, chemmilling the active areas 30 and 32 to yield recesses or depressions in the nature of pockets 34 and 36 separated by, in this instance, a medial, raised element 38. Comparing the progression thus far, the recesses or pockets 34 and 36 conform generally to the region for lines within the die to be produced, of oversized width dimension in the working face 12 relative to that ultimately desired, while the raised element 38 conforms to a space region of the die, located centrally with respect to the spatial disposition thereof and undersized rather considerably on a percentage basis as respect the ultimate width to be achieved. Simply to consider some representative dimensions at this juncture, for a 10 mil line-and-space die, the initial glass plate pattern is advantageously a +2.5 image pattern, yielding opaque regions (18, 10) of 15 mils thereby leaving but 5 mils for the transmissive space region 22. The development of that dry film resist increases the width dimension ultimately provided in the active regions 30 and 32 by approximately 0.5 mils; hence, the retained film 28 is now reduced to about 4 mils in width. Continued chemmilling increases the width dimension of the pockets 34 while reducing the width dimension of the upstanding or raised element 38; the pockets now achieving a surface width of approximately 17 mils with a depth on the order of 1.2 mils, leaving approximately 3 mils for the width of the raised element. Indeed, controlling the etching procedure to achieve these levels of undercut during the initial procedure is an expedient way of not only tolerating this heretofore troublesome occurrence but utilizing it fully for obtaining the improved results of the present invention. Thus, the procedure is allowed to continue until the desired undercut is achieved; the aforementioned dimensional limits being representative of one highly acceptable result along those lines.

Once the pockets or depression 34 and 36 have been chem-milled within the working face 12 to the desired extent (about 17 mils wide and about 1.2 mils deep), the film retained on the working face (i.e., the developed remnants of dry film 14) is removed and the working face 12 is cleaned. The recesses 34 and 36 are now filled with an etchant-resistant composition, most preferably epoxy, to yield etchant-passive pockets 40 and 42 outwardly bounding the raised and active region 38. The. e.g., epoxy fill is milled or otherwise surface smoothed to attain a flat surface, typically reducing the depth dimension of the chem-milled pockets. Continuing with an exemplary consideration along these lines, recesses that were formerly 1.2 mils will customarily be reduced to yield filled pockets on the order of 1 mil. That blank then receives an oversized, negative acting film resist 44 as shown in FIG. 4, here shown to be a +17 film developed upon preliminary exposure with ultraviolet radiation through a +17 negative pattern (i.e., one where the die element areas are clear and 0.017" larger per side). This overlay protects the working face 12 both in the regions where lines are to be formed as well as those where spaces are to occur. The purpose of the overlay film 44 is to mask that area while an initial or preliminary background cut of the die blank 10 is made by etching the same, resulting generally in the configuration shown in FIG. 5. In this instance, a background cavity precursor 46 is initiated along the marginal edges of the die blank 10, having been milled or etched downwardly within the face 12 and inwardly from its edge, undercutting the film 44 at and along a surface 48 thereof. In this particular instance, one working example would permit the initial etching of the background cavity 46 to proceed until an undercut in region 48 achieved about a 4 mil (0.004") width dimension, at which time a depth dimension for the background cavity precursor 46 would typically be about 10 mils.

Once the main background cut 46 has proceeded to the desired extent, as typified in FIG. 5, the masking overlay film 44 is removed to expose the working face 12, save those areas having the etchant-resistant pockets. The resist layer 44 may be removed by grinding or dissolution via solvent, to leave an etchant-active region within the surface contours of the pockets and bounded outwardly thereof. Thus, the region such as that denoted 38 in FIG. 5 which will ultimately conform to a space may now be chem-milled in order to established separating cavity precursors, while the background cavity precursors 46 are subjected to yet further milling in the etchant bath. That results generally in a die configuration shown in FIG. 6. With the ability of etchant to mill the working face 12 intermediate the pockets 40 and 42, a separating cavity 50 is established while background cavities 52 proceed to be milled deeper and wider than the precursors 46 shown in FIG. 5. The pockets 40 and 42 are now undercut within the separating cavity region 50, as shown at 54, while the pockets are likewise undercut within the region extending outwardly into the background cavities, as indicated generally at 56. This chemical milling procedure is allowed to continue in the exemplary situation herein described until the width of the separating cavity precursor 50, as measured at the surface juncture of the working face 12 between the undercut edges within regions 54, is approximately equal to the space width ultimately desired in the finished die. Accordingly, in this representative example of the invention, chemical milling of the die is allowed to proceed until the width of the separating cavity precursor 50 is approximately 10 mils. At that time, using conventional chem-milling procedures on conventional steel blanks, the depth of the precursor cavity 50 will be approximately 8 mils; the background cavity will then have increased in depth to about 17 mils and in width to a point leaving approximately 10 mils for the line regions beneath each of the pockets (comparing, for example, the width of working face 12 beneath these pockets as shown in FIG. 6 with the spacing exemplified in FIG. 1).

With the die in the form represented generally in FIG. 6, the background and separating cavities are essentially formed. The general pattern of separating cavities is milled into the die leaving upstanding regions which will ultimately be chem-milled to form the active die elements. The procedure most preferably continues to begin the development of those raised elements. Most preferably, the raised die regions which are now masked beneath the resistant pockets 40 and 42 are chemically milled to establish knife edge configurations in the desired die pattern. For that purpose, the epoxy or other inert filler is removed, most preferably by grinding or, if desired, by dissolution with a solvent. In either event, the working face of raised elements is prepared to receive a photo resist film which will be exposed and developed to continue the die fabrication procedure. Preparatory to that, the cavities which have been established in the working face are first filled with an epoxy in order to support that film. In accordance with the technique disclosed and claimed in the present inventor's application Ser. No. 365,368, filed Apr. 5, 1982, the cavities are initially, preferably, plated with an etchant-resistant film such as one of gold, platinum or other noble composition with respect to the etchant employed. Although that is an entirely optional step, it has been determined that the preliminary plating of the cavities in advance of the loading thereof, with epoxy or the like, protects the die from unwanted and inadvertent etching should the fill separate slightly from the cavity region. For a better understanding of that technique, attention is invited to the aforementioned application.

Figure 7:
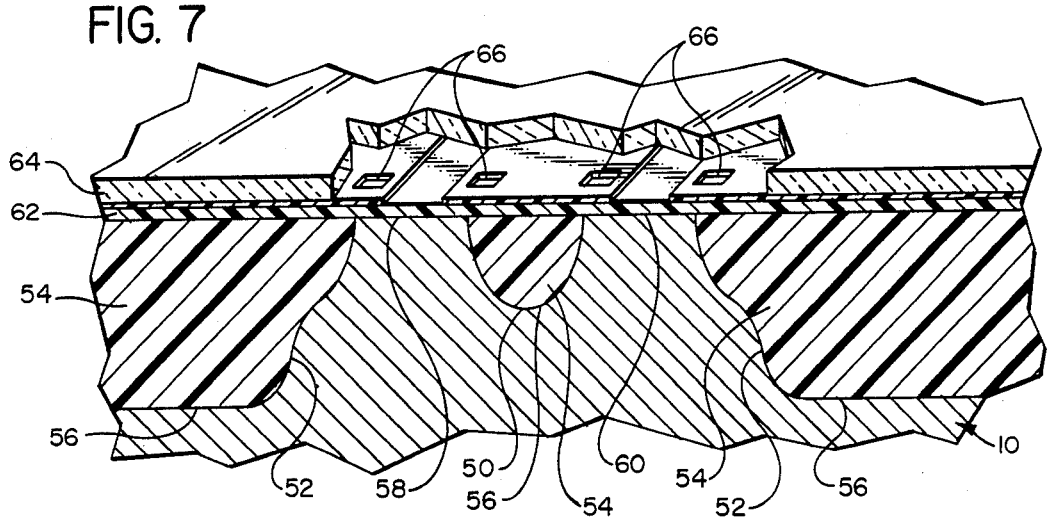
FIG. 7 is a partially isometric view of the die blank prepared through the procedure shown in FIG. 6, here illustrating a charge of etchant-resistant fill in the background and separating cavities to support a dry film photo resist which is exposed in a desired pattern for the next sequence in the formation of raised die elements.

FIG. 7 illustrates a configuration for the next stage in the sequence of die fabrication. The die blank 10 receives epoxy fill, designated generally as 54, within each of the separating cavities 50 and background cavities 52. A film 56 of an etchant resistant material, such as gold, is included on the surface of these cavities for the aforesaid reasons. The top surface of the die is ground flat to remove any film borne thereon and to yield a surface comprised of upstanding die element precursors 58 and 60. The grinding procedure insures flatness across the die face; the surfaces of the precursors 58 and 60 being flat with respect to the surfaces of the epoxy fill 54 within the various cavities across the die. A resist film 62 is adhered to the working face in a conventional manner. A glass plate or film 64 bearing the art work conforming to the finished die elements is disposed above the film. In this instance a plurality of alignment windows 66 are provided in the art work; as the name tends aptly to imply, for the purpose of establishing alignment of that photographic image on the plate 64 vis-a-vis the contours of the raised precursors 58 and 60, preferably at the junctures with the adjacent cavities.

Figure 8:
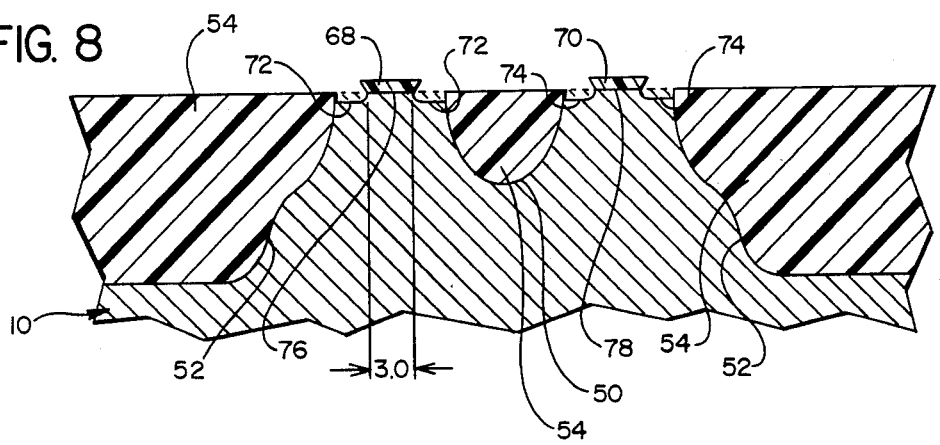
FIG. 8 is a side elevation view of the die illustrated in FIG. 7, following the exposure and removal of the unwanted portion of the dry film resist and the inclusion of boundary grooves along the margins where raised die elements are to be formed.

Returning to the exemplary dimensions recited herein in order to provide an illustrative representation assisting the skilled artisan in an appreciation of the limits of accuracy which can be attained by the present method, the art work in plate 64 (which is disposed with the emulsion side against the resist film 62) is most preferably a −2.0 (mil) negative photographic image of the die elements ultimately to be produced. With the plate in proper alignment as insured via the alignment window 66, sensitizing UV radiation is used to expose that resist film, which is then developed to leave a protective region centrally of the raised precursors 58 and 60. More specifically, with reference to FIG. 8, development of the resist film 62 upon exposure leaves a winding ribbon of resist along each of the raised die elements, represented here as passive films 68 and 70 with respect to the raised precursors 58 and 60, respectively. The exemplified −2.0 art work operating on a 1.0 mil dry film resist will leave a film having an effective width of about 5.0 mils disposed centrally of the 10 mil width of each of these die element precursors. The die 10 is then prepared for further etching which includes the removal of the small "tabs" of resist material which will be formed at each of the locations of alignment window 66. With the die in that condition, it is chem-milled for a short amount of time to form marginal pockets or boundary grooves 72 and 74 within the uppermost surface regions of the raised die element precursors 68 and 70. The milling continues, usually for less than about one minute, simply to form these pockets to a depth sufficient to receive an epoxy fill to be retained therein. For example, a pocket about 0.8 mils (0.0008") is usually sufficient, this accounting for very little undercut beneath the protective resist ribbon 68 and 70. Once that is achieved, the resist on the working face is removed (by grinding or dissolution with solvent) and these marginal pockets 72 and 74 charged with a suitable filler such as epoxy. That surface is then ground flat to leave stepped, raised die element precursors such as those identified generally as 76 and 78 as best envisioned with reference to FIG. 8.

Figure 9:
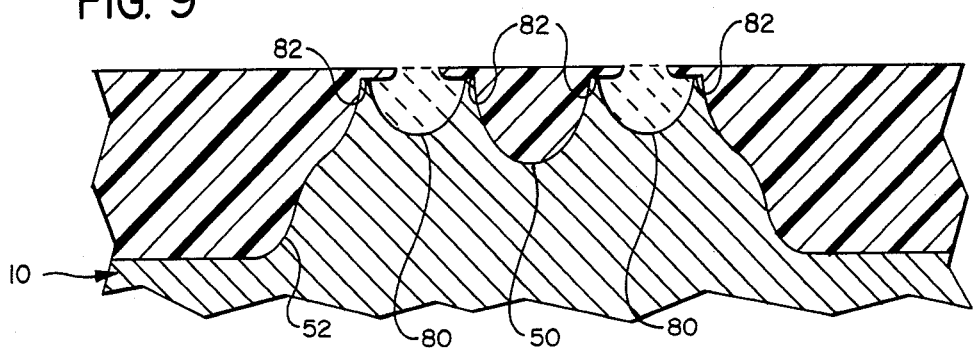
FIG. 9 is a side elevation view of the next intermediate stage of fabrication, wherein die element cavities are formed by chemical milling the active regions intermediate the boundary grooves.
Figure 10:
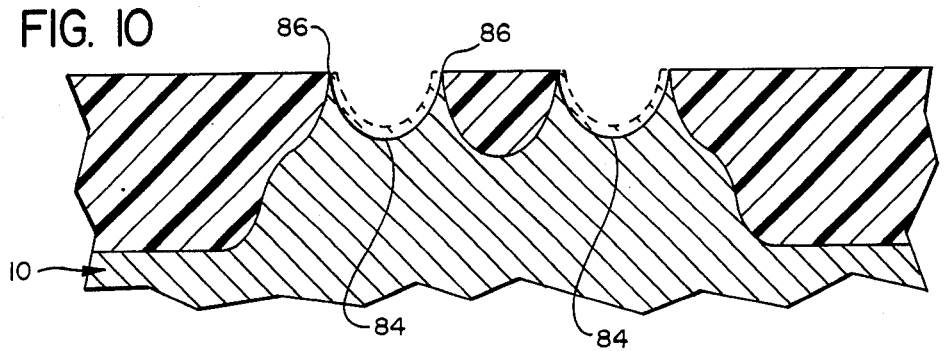
FIG. 10 is a side elevation of the die shown in FIG. 9 at the next stage of the procedure, wherein the etchant-resistant boundary grooves are completely undercut and the cavities milled slightly further to sharpen the knife edges of the die element; and, FIG. 11 is a side elevation view of a portion of a finished die made in accordance with the present invention.
Figure 11:
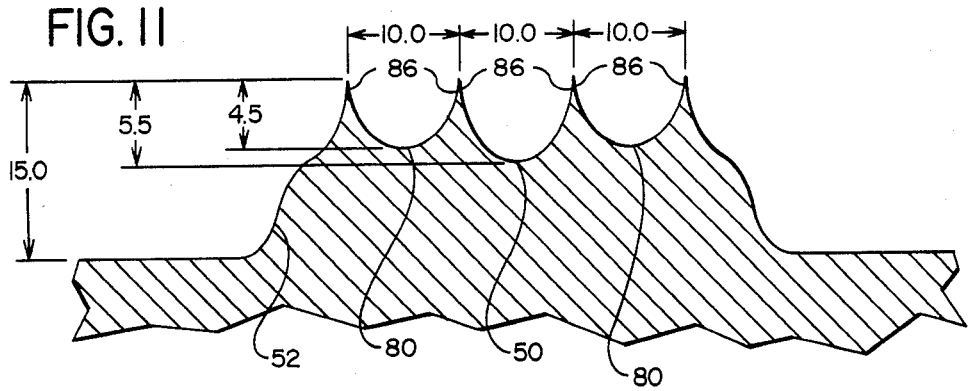

The die is next subjected to a further chemical milling procedure. The entire working face save the very central region of each die element precursor is etchant passive by virtue of the epoxy fill retained in the cavities previously formed therein. Hence, only those regions ultimately to operate as raised die elements are milled during this stage of the sequence. The etching procedure is allowed to continue until those regions are milled to form die element recesses approaching the ultimate desired width of the die elements, as best viewed in FIG. 9. Here the die element recesses, identified as 80, are chem-milled as the marginal grooves 72 and 74 are undercut. This chem-milling of the cavities 80 toward the separating background cavities thus leaves relatively wide but raised knife edge precursors 82 at each boundary. Returning to the dimensions being considered as representative herein, the milling procedure is allowed to continue until the so-called "dinking" depth or depth of the die cavity 80 reaches about 5 mils or until the epoxy resist is undercut by about 2 mils. At that time, the die is removed, cleaned, and the resist is ground back to leave a die such as that shown in FIG. 10. That die is then subjected to a sharpening operation; it may be mechanically sharpened or, more preferably, by returning it to the etchant bath to remove a slight amount of material, identified generally as 84, from each of the die element cavities 80. That provides a slight deepening of these cavities but, more importantly, sharpens the marginal edges between the adjacent cavities to yield very sharp and well defined knife edges 86, ultimately yielding the die shown in FIG. 11. The die of FIG. 11 exhibits much greater uniformity in terms of the etched pattern than is currently achievable by means of conventional photo resist techniques and further exhibits a vastly improved depth-to-undercut ratio when compared with the achievable profiles using those same conventional methodologies.

In order to tie the foregoing description together, the following example is given. For the sake of convenience, the dimensions set forth in the example conform exactly to those in the figures of drawing.

EXAMPLE

A piece of tool steel is ground to form a flat, parallel working face for a die blank. This die blank is destined to be used as a circuit stamping die having a 10 mil line-and-space pattern of circuit elements. The blank is scrubbed with pumice and water, water rinsed and then air dried. It is heated to about 212° F. and then cooled to ambient to remove any residual moisture.

A dry film photo resist having a thickness of 1.0 mil is applied to the ground face of the die blank under "safelight" conditions. A glass plate having a line-and-space pattern is disposed over the resist film with the emulsion of the plate in face-to-face contact therewith. The resist film is a negative acting one, and therefore the photographic image on the plate is a positive one with line areas being blank or opaque to sensitizing radiation. Desiring to form a 10 mil line-and-space array, the image on the glass plate is 0.0025" wider per side respecting the line or circuit areas (insofar as the die to be produced is a circuit stamping die). The resist is exposed through the +2.5 positive plate with UV light.

The exposed film is developed in accordance with conventional techniques. That removes the film which had been unexposed (i.e., that beneath the opaque circuit area), leaving the same etchant active. The film is slightly undercut by about ½ mil at each edge during developing, thereby increasing the effective line width by about 1 mil. The zones corresponding to those line areas are thence chem-milled in a ferric chloride bath at about 100° F., to yield a recess in the circuit areas approximately 1.2 mils deep. That too is accompanied by some undercutting of the film, once again approximately ½ mil per edge. Hence, the line region is now expanded to approximately 17 mils while the working face within the space zone is reduced to approximately 3 mils.

The dry film resist utilized to establish the location of pockets is removed and the die blank is once again scrubbed with pumice and water, rinsed and air dried. The blank is heated to about 212° F. and then cooled to ambient. Each of the milled recesses is filled with epoxy resin which is allowed to harden. The resin is milled and the working face surface ground to reestablish a flat and parallel face. This removes some material from the top face, such that the filled pockets are now approximately 1 mil in depth while retaining the surface width of approximately 17 mils. The die blank is again scrubbed with pumice and water, rinsed, dried, heated to drive off residual moisture (i.e., to about 212° F.) and thence cooled to ambient.

A 2.0 mil dry film resist is adhered to the working face of the die. It is exposed with UV radiation through a +17.0 negative pattern. The exposed film is developed to leave a centrally located mask protecting the entire circuit region of the die. The thus prepared blank is thence chem-milled to initiate a background cut. Milling continues until the protective resist is undercut by approximately 4 mils leaving a background cavity precursor of about 10 mils as measured along the die edge.

The +17 resist is removed by dissolution with a solvent. The die is returned to the etchant bath to chem mill the regions corresponding to the die spaces, those being the regions intermediate the etchant-resistant pockets. This subsequent etching procedure also serves to deepen and widen the background cavities during the establishment of the separating cavity in this manner. Chemical milling is allowed to continue until the etchant-resistant pockets are undercut by about 3.5 mils thus leaving a raised region immediate beneath each pocket approximately 10 mils in width, corresponding to the desired line width and spacing.

The epoxy resist constituting the pockets, now partially undercut, is removed by solvent dissolution. The die is scrubbed with a wire brush, and thence with pumice and water. It is water rinsed and air dried until free from residual moisture. The die blank in that form is then gold plated to establish a film approximately 0.0001". The gold film covers the entire working face of the die, including now the recessed separating cavity precursors and background cavity precursors which are approximately of finished dimension at this stage. The film is removed by grinding the raised die element precursors which had formerly been protected by the resistant pockets in order to prepare the die for subsequent processing by what is known as a "picture process".

A contact print utilizing −2.0 negative art work is prepared. Alignment windows are included within the art work in order to facilitate accurate disposition of the plate over the raised elements in the die blank which will ultimately be milled to yield the raised knife edges in the finished die. The plated die blank is then filled with epoxy within the die cavities, which is allowed to harden. The die blank is then surface ground once again to establish a "picture flat" and parallel working face. A 1.0 dry film resist is adhered to the working face, supported by the epoxy fill across the cavity region; the die having previously been scrubbed and dried to remove residual moisture prior to that stage. The −2.0 negative art work in the glass plate is disposed over the dry film resist with the emulsion side down, utilizing the alignment windows to insure conformity between the pattern of circuit traces and the raised die elements wherein the ultimate lines of the die are to be formed. The resist is exposed with UV radiation and then developed, leaving a central ribbon of resist approximately 5.0 mils wide located along each of the raised metal regions. Tabs of retained resist are likewise created upon exposure through the windows in the art work, but these are trimmed away at this time. The die is then chem-milled for about 40 seconds, or until the regions disposed between the epoxy filler and the retained ribbons of resist are approximately 0.0008" deep. The gold plate previously deposited within the cavities guards against uncontrollable etching at the juncture of the fill and the raised die element precursors should there occur any slight separation of the epoxy. Accordingly, defined boundary grooves are established at either edge of the die element precursors.

The film ribbons of resist are removed from the working face of the die. It is scrubbed with pumice and water, rinsed and dried at an elevated temperature, thence cooled to ambient. The grooves are filled with epoxy which is allowed to harden; then the surface is milled and ground to expose the metal confined between the boundary grooves. The die blank is returned to the etchant bath and a cavity is chem-milled as the boundary grooves are undercut. This chem milling procedure continues until the so-called "dinking" depth reaches approximately 0.005" and/or the epoxy resist within the boundary grooves is undercut by 0.002". Upon such an occurrence, the die blank is removed from the etchant bath and the surface is ground to remove the undercut epoxy elements and true the top face once again. The die is scrubbed to remove any carbon deposits from the element traces and is then returned to the etchant bath for sharpening. That chem-milling step is allowed to proceed approximately 40 seconds, which completes the depth of the die element cavity and sharpens the knife edge elements of the die. The die is then heated and the epoxy removed. Subsequently, it is scrubbed with a soft brass brush and pumice and water, rinsed and air dried to yield a finished die configuration.

While the invention has now been described with reference to certain preferred embodiments, exemplified with respect thereto, and represented by specific dimensions, all with an eye toward a complete description thereof, those skilled in the art will appreciate that certain modifications, changes, omissions, and substitutions may be made without departing from the spirit thereof. For example, although the invention has been discussed with reference to dies destined for circuit stamping, other types of dies having diverse utilities may be made in accordance with the instant method and the benefits of the present invention thereby realized. Accordingly, the foregoing description is intended simply to be illustrative and is not meant to be limitative on the scope of the claims granted herein.

What is claimed is:

1. A method for fabricating a precision die by chemical milling the working face of an etchable workpiece to form a plurality of raised die elements separated and bounded by a plurality of cavities in a line and space array, said method comprising the steps of:
   a. forming an etchant-resistant surface pattern of pockets penetrating slightly into the working face of an etchable workpiece at least partially overlapping outwardly of, and substantially conforming to, the spatial disposition of a desired configuration for raised die elements in a finished die; and,
   b. selectively etching said workpiece in etchant-active regions intermediate and outwardly bounded by said pockets to undercut the same and form die cavity precursors within said working face.

2. The method of claim 1, wherein said step of selectively etching said workpiece to form said cavity precursors comprises etching said workpiece to develop a surface width dimension for said cavity precursors approximately equal to the desired surface width dimension for the finished die configuration, thereby defining raised die element precursors separated and bounded by said cavity precursors.

3. The method of claim 2, wherein said step of forming said pockets comprises the steps of:
   a. preparing surface depressions within said working face; and,
   b. charging said depressions with an etchant-resistant filler.

4. The method of claim 3, wherein the surface width dimension of said pockets is greater than the desired surface width dimension for the raised die elements of the finished die configuration.

5. The method of claim 4, further comprising the steps of:
   a. providing an etchant-resistant surface on said working face within the region of said cavity precursors following the chemical milling thereof;
   b. forming an etchant-resistant surface pattern of boundary grooves penetrating slightly into said working face along the marginal edges of said die element precursors; and,
   c. selectively etching said working face in etchant-active regions intermediate said boundary grooves and undercutting same to yield die element cavity precursors.

6. The method of claim 5, wherein the steps of forming said etchant-resistant surface patterns of pockets and boundary grooves comprise the steps of:
  a. chemical milling said pockets and grooves; and,
  b. loading said pockets and grooves with an etchant-resistant epoxy filler.

7. The method of claim 6, wherein the surface patterns of said pockets and boundary grooves are photographically outlined on said working face with a protective overlay of an etchant-resistant film having a pattern corresponding to the positions of said pockets and grooves whereby said working face is etchant active within the contours of said film.

8. The method of claim 7, wherein said step of selectively etching said working face to yield said die element cavity precursors comprises etching said working face to develop a surface width dimension for said die element cavity precursors approaching the desired surface width dimension for the finished die configuration, thereby yielding knife edge precursors.

9. The method of claim 8, further comprising the steps of:
  a. removing the fill from said boundary grooves; and,
  b. chemically milling said die element cavity precursors to sharpen said knife edge precursors and thereby yield a finished die configuration of raised die elements including opposed knife edges in a line and space array.

10. A method for fabricating a precision die by chemical milling the working face of an etchable workpiece to form a plurality of raised die elements separated and bounded by a plurality of cavities in a line-and-space array, said method comprising the steps of:
  a. forming an etchant-resistant surface pattern of pockets penetrating slightly into the working face of an etchable workpiece, masking the regions corresponding to the desired location for raised die elements in the finished die configuration and having a surface width dimension greater than the desired finished line width;
  b. selectively etching said workpiece in etchant-active regions intermediate and outwardly bounded by said pockets to undercut the same and form die cavity precursors within said working face having a width approximately equal to the desired space width in the finished die configuration;
  c. forming an etchant-resistant surface pattern of boundary grooves along the marginal edges of said raised die element precursors; and,
  d. selectively etching etchant-active regions intermediate said boundary grooves to undercut the same and form die element cavity precursors having a width approaching substantially the desired line width.

11. The method of claim 10, further comprising the step of sharpening the die by chemical milling same to yield a finished die configuration.

12. A method for fabricating a precision die by chemical milling the working face of an etchable workpiece to form a plurality of raised die elements separated and bounded by a plurality of cavities in a line-and-space array, said method comprising the steps of:
  a. photographically impressing a surface pattern on the working face of an etchable workpiece, said pattern including etchant-active regions intermediate and bounded by an etchant-resistant film having a negative pattern corresponding to the contours of an oversized line array for a finished die configuration;
  b. chemical milling surface depressions within the etchant-active regions defined in said working face;
  c. loading said depressions with an etchant-resistant fill to yield etchant-resistant pockets within said working face penetrating slightly therein and at least partially overlapping the line region for the finished die configuration and extending into the space region thereof;
  d. depositing a first protective overlay upon said working face, masking the interior dimensions of said workpiece wherein said line-and-space array is to be formed;
  e. etching said workpiece to perform a first background cut therein;
  f. removing said protective overlay to expose the working face in regions bounded by said etchant-resistant pockets;
  g. selectively etching said workpiece to undercut said pockets and thereby form separating cavity precursors within the space regions of said workpiece and deepen said background cut, said etching step yielding raised die element precursors having a width approximately equal to the desired line width;
  h. removing said pockets from said working face;
  i. charging said cavities with an etchant-resistant fill for protecting the same and supporting a protective film;
  j. adhering a photosensitive protective film to the working face and exposing same to establish a pattern in the form of a protective overlay disposed centrally of said die element precursors;
  k. etching boundary grooves along the marginal edges of said die element precursors defined intermediate said protective film and said etchant-resistant filler;
  l. selectively etching the regions within said die element precursors intermediate said boundary grooves, to undercut the same and form die element cavity precursors;
  m. trimming said fill from said boundary grooves;
  n. etching said workpiece within said die element cavity precursors to yield a finished die having raised die elements defined between knife edges separated by a line width as respects a given die element and a space width across separating cavities as respects adjacent die elements.

13. The method of claim 12, further comprising the step of adhering an etchant-resistant film within said cavity precursors prior to the step of charging same with said etchant-resistant fill.

* * * * *